(12) United States Patent
Pedersen et al.

(10) Patent No.: US 8,605,401 B2
(45) Date of Patent: Dec. 10, 2013

(54) SYSTEMS AND METHODS FOR SECURING A PROGRAMMABLE DEVICE AGAINST AN OVER-VOLTAGE ATTACK

(75) Inventors: Bruce B. Pedersen, Sunnyvale, CA (US); Dirk A. Reese, Campbell, CA (US)

(73) Assignee: Altera Corporation, San Jose, CA (US)

( * ) Notice: Subject to any disclaimer, the term of this patent is extended or adjusted under 35 U.S.C. 154(b) by 117 days.

(21) Appl. No.: 13/097,313

(22) Filed: Apr. 29, 2011

(65) Prior Publication Data

US 2012/0275077 A1    Nov. 1, 2012

(51) Int. Cl.
*H02H 3/20*    (2006.01)

(52) U.S. Cl.
USPC ............................. 361/91.1; 326/8; 360/323

(58) Field of Classification Search
USPC .................. 326/8; 361/88, 90, 91.1; 360/323
See application file for complete search history.

(56) References Cited

U.S. PATENT DOCUMENTS

| | | | |
|---|---|---|---|
| 5,313,112 A * | 5/1994 | Macks ........................... | 327/143 |
| 5,768,372 A | 6/1998 | Sung et al. | |
| 5,915,017 A | 6/1999 | Sung et al. | |
| 6,819,539 B1 * | 11/2004 | Wright et al. .................... | 361/90 |
| 7,142,400 B1 * | 11/2006 | Williams et al. ................ | 361/18 |
| 7,479,798 B1 | 1/2009 | Reese | |
| 2001/0021092 A1 * | 9/2001 | Astala ............................. | 361/90 |
| 2002/0122280 A1 * | 9/2002 | Ker et al. ......................... | 361/56 |
| 2006/0158444 A1 * | 7/2006 | Huang ........................... | 345/211 |
| 2006/0222059 A1 * | 10/2006 | Ruff et al. ..................... | 375/219 |
| 2008/0074817 A1 * | 3/2008 | Crain et al. .................. | 361/91.1 |
| 2008/0189461 A1 * | 8/2008 | Kim .............................. | 710/261 |
| 2009/0059440 A1 * | 3/2009 | Moe et al. ..................... | 360/323 |

* cited by examiner

*Primary Examiner* — Jason M Crawford
(74) *Attorney, Agent, or Firm* — Ropes & Gray LLP

(57) ABSTRACT

Systems and methods are disclosed for securing a programmable integrated circuit device against an over-voltage attack. Generally, programmable devices, such as FPGAs, contain volatile memory registers that may store sensitive information. To prevent tampering and/or reverse engineering of such a programmable device, an over-voltage detection circuit may be employed to disable the device and/or erase the sensitive information stored on the device when an over-voltage attack is suspected. In particular, once the over-voltage detection circuit detects that the voltage applied to the programmable device exceeds a trigger voltage, it may cause logic circuitry to erase the sensitive information stored on the device. Desirably, the over-voltage detection circuit includes components arranged in such a way as to render current consumption negligible when the voltage applied to the programmable device, e.g., by a battery, remains below the trigger voltage.

20 Claims, 4 Drawing Sheets

SYSTEMS AND METHODS FOR SECURING A PROGRAMMABLE DEVICE AGAINST AN OVER-VOLTAGE ATTACK

BACKGROUND OF THE INVENTION

This invention relates to systems and methods for securing data stored within a programmable device—e.g., a field-programmable gate array (FPGA) or other programmable logic device (PLD)—against copying and/or other tampering.

Programmable devices are well known. Generally, programmable devices, such as FPGAs, contain volatile and non-volatile storage components within which sensitive information may be stored. For example, an encryption key—used to decrypt encrypted data within the device—may be stored in a volatile register of the programmable device.

An attacker, or other illicit user, may employ any number of techniques to recover and/or copy this sensitive information. One favored attack involves running the programmable device under extreme conditions. For example, an attacker may apply an excessive voltage to the device in the hope that the device will act in an unpredictable fashion, potentially providing access to sensitive information otherwise secured. This technique is commonly known as an over-voltage attack, and it includes subjecting the device to voltage spikes and/or a heightened voltage level for some length of time.

SUMMARY OF THE INVENTION

The present invention relates to systems and methods for securing a programmable integrated circuit device against an over-voltage attack.

In accordance with embodiments of the present invention, there is provided a programmable integrated circuit device having a register, over-voltage detection circuitry, and logic circuitry. The register, which is coupled to a voltage source, is configured to store a value of at least one bit. The over-voltage circuitry is configured to detect the voltage produced by the voltage source and to generate an over-voltage signal if the detected voltage is greater than or equal to a trigger voltage. The logic circuitry, in turn, is configured to clear the register whenever an over-voltage signal is generated.

In accordance with additional embodiments of the present invention, the over-voltage detection circuitry is powered by the aforementioned voltage source. Specifically, the over-voltage detection circuit is powered by the same voltage supply it is configured to monitor for excessive voltage. It is a desirable feature of the present invention that the over-voltage detection circuit may continue to secure the programmable device even as the shared power supply is manipulated.

In accordance with additional embodiments of the present invention, the over-voltage detection circuitry draws a negligible amount of current when the detected voltage is less than the trigger voltage. In other words, the leakage (i.e., quiescent) current of the over-voltage detection circuitry is extremely low. As such, if the programmable device is powered by battery, the effect of the implemented over-voltage protection on battery life is minimized.

In accordance with additional embodiments of the present invention, the over-voltage detection circuitry includes a voltage sensing block (e.g., a series of stacked diodes) and a switch circuit for producing the over-voltage signal. The voltage sensing block has a characteristic activation voltage such that, for example, the voltage sensing block "turns on" (i.e., conducts current) only when the voltage produced by the voltage source exceeds or is equal to the characteristic activation voltage. In this manner, current consumption by the over-voltage detection circuitry remains negligible unless and until excessive voltage is present. When the latter occurs, the voltage sensing block asserts a control signal, which increases as the voltage produced by the voltage source increases. When the voltage of the control signal reaches or exceeds a threshold voltage of the switch circuit, the latter produces the over-voltage signal, thereby clearing the register. The switch circuit may be any suitable configuration of circuitry that provides switch-like behavior, such as a transistor configured to output a high or low voltage. Alternatively, the switch circuit may provide a more gradually increasing and/or decreasing signal. The switch circuit may include any number of transistors and/or resistive elements.

Methods of configuring and operating the above-described programmable integrated circuit devices are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

To prevent tampering and/or reverse engineering of a programmable device by way of an over-voltage attack, a feature that disables the device and/or erases the sensitive information stored thereon whenever an over-voltage attack is suspected is desirable.

Accordingly, systems and methods are described herein for employing an exemplary anti-tampering technique when an over-voltage attack is suspected. In particular, an over-voltage detection circuit is described herein that detects the voltage applied to the programmable device and determines if this voltage exceeds a trigger voltage value. If it does, the over-voltage detection circuit may cause logic circuitry to erase the sensitive information stored on the device. The over-voltage detection circuit is composed of components arranged in such a way as to render current consumption negligible when the voltage applied to the programmable device remains below the trigger voltage value. Thus, in normal use, if the device is powered by a battery, the over-voltage detection circuit minimally affects battery life.

Figure 1:
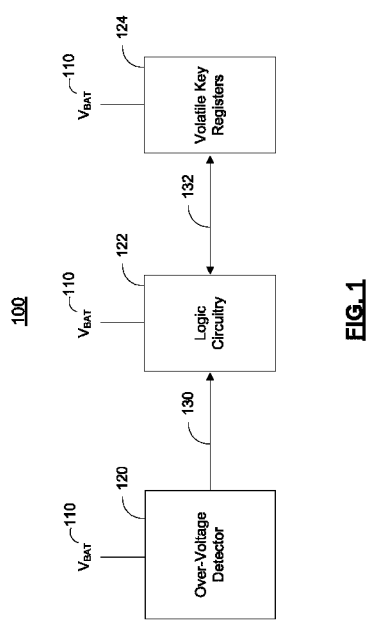
FIG. 1 depicts a block diagram of a programmable logic device with over-voltage detection circuitry, according to an illustrative embodiment of the present invention.

FIG. 1 shows illustrative device 100 that includes over-voltage detection circuitry 120, logic circuitry 122, and volatile key registers 124 in accordance with some embodiments of the present invention. Logic circuitry 122 may be part of a programmable logic core that can be configured according to configuration data that is programmed by a user. In an embodiment, logic circuitry 122 is programmed to clear volatile key registers 124, for instance, when an illicit attack (e.g., an over-voltage attack) on device 100 is detected. Clearing volatile key registers 124 may include overwriting the contents of volatile key registers 124 with other data, such as all '0' values, all '1' values, or a combination thereof.

In an exemplary embodiment, device 100 is an FPGA; however, device 100 may be any other suitable form of a circuitry. For example, device 100 may be an application-specific integrated circuit (ASIC) or any suitable programmable logic device. It should also be understood that device 100 may be a combination of devices, such as an FPGA and an ASIC, and/or may include additional, standalone circuit components. For instance, over-voltage detection circuitry 120 may be included within an FPGA that also includes logic circuitry 122 and volatile key registers 124. Alternatively, over-voltage detection circuitry 120 may be part of a separate ASIC, or may be composed of discrete circuit components coupled to logic circuitry 122.

Figure 2:
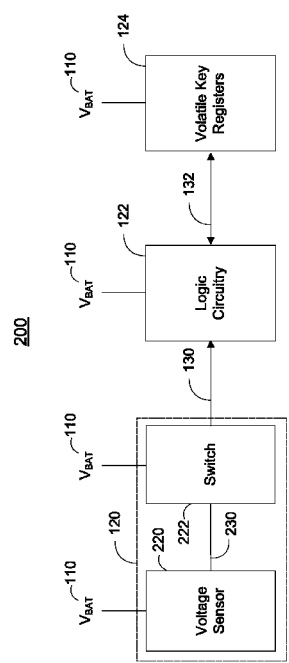
FIG. 2 depicts a more detailed block diagram of the over-voltage detection circuitry of FIG. 1, according to an illustrative embodiment of the present invention.
Figure 3:
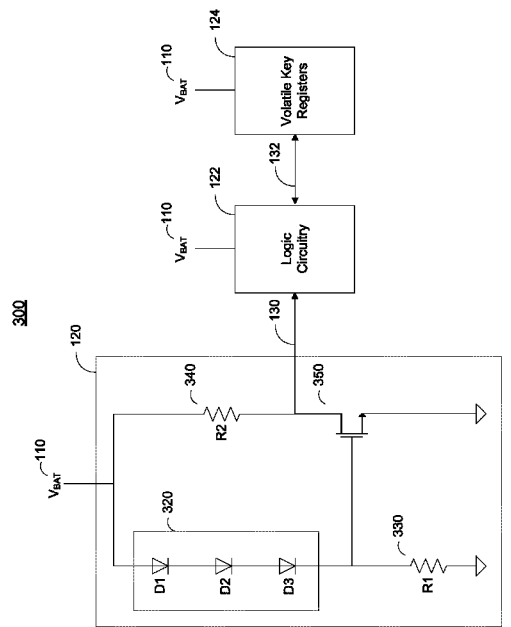
FIG. 3 depicts an exemplary implementation of the over-voltage detection circuitry of FIG. 1, according to an illustrative embodiment of the present invention.

In some embodiments, device 100 includes various types of volatile and nonvolatile registers for storing, for example, encryption keys, security option information, and/or security option configurations. However, for reasons of simplicity, only volatile key registers 124 are shown in FIGS. 1-3. Volatile key registers 124 may include one or more individual registers for storing bits. In one embodiment, volatile key registers 124 include a number of volatile registers for storing an encryption key.

In particular, volatile key registers 124 may be used to store an encryption key that is used to decrypt and/or encrypt, for example, configuration data. In some approaches, the encryption key is based on the advanced encryption standard (AES). Further details regarding various embodiments of encryption keys and their use in encryption and decryption are discussed in greater detail in copending, commonly-assigned U.S. patent application Ser. Nos. 13/097,205 and 13/098,315, filed Apr. 29, 2011, which are hereby incorporated by reference herein in their respective entireties.

In some embodiments, over-voltage detection circuitry 120, logic circuitry 122, and volatile key registers 124 share the same voltage source ($V_{BAT}$) 110. Thus, over-voltage detection circuitry 120 may be powered by the same voltage source it is monitoring for excessive voltage. However, although over-voltage detection circuitry 120, logic circuitry 122, and volatile key registers 124 are depicted as sharing voltage source 110, it should be understood that one or more other voltage sources may be employed. For example, over-voltage detection circuitry 120 may be powered by another voltage source, but may monitor voltage source 110 as it is applied to volatile key registers 124.

In some embodiments, over-voltage detection circuitry 120 detects when voltage source 110 is greater than or equal to a given trigger voltage. For example, the trigger voltage may be any voltage greater than the normal operating voltage of the device. The composition of over-voltage detection circuitry 120 will be discussed further below in connection with FIGS. 2 and 3, but it should be understood that any suitable circuitry may be used to determine when voltage source 110 exceeds or equals the trigger voltage. For example, a voltage sensing device and a comparator may be employed. Alternatively, a diode stack and transistor may be used, as discussed below.

When over-voltage detection circuitry 120 detects that voltage source 110 is greater than or equal to a given trigger voltage, an over-voltage signal 130 may be generated. In an exemplary embodiment, signal 130 is provided to logic circuitry 122. For example, the output of over-voltage detection circuitry 120 may be coupled, or connected directly, to an input of logic circuitry 122. Logic circuitry 122 includes logic circuitry for clearing volatile key registers 124, as discussed above. For instance, when logic circuitry 122 receives over-voltage signal 130, logic circuitry 122 may overwrite the data stored in volatile key registers 124 via communications path 132.

FIG. 2 depicts over-voltage detection circuitry 120 of FIG. 1 in greater detail, in accordance with some embodiments of the present invention. In particular, FIG. 2 shows illustrative device 200, which may be substantially similar to device 100 of FIG. 1. As shown, over-voltage detection circuitry 120 may include voltage sensing circuitry 220 (also referred to herein as a voltage sensing block) and switch circuit 222. Voltage sensing circuitry 220 may be coupled to voltage source 110 and, in some embodiments, powered by voltage source 110. Similarly, switch circuit 222 may be coupled to voltage source 110 and, in some embodiments, powered by voltage source 110. Although not depicted, it should be understood that, in some embodiments, voltage sensing circuitry 220 and/or switch circuit 222 may be coupled to voltage source 110 but powered by a voltage source other than voltage source 110.

Voltage sensing circuitry 220 may detect when voltage source 110 is greater than or equal to a given threshold voltage and, in turn, may generate a control signal 230. Control signal 230 may be provided to switch circuit 222, which may produce over-voltage signal 130 in response. As discussed above, in connection with FIG. 1, over-voltage signal 130 may be provided to logic circuitry 122, which may then clear the contents of volatile key registers 124.

In some embodiments, voltage sensing circuitry 220 has a characteristic activation voltage; that is, a voltage at which the voltage sensing circuitry 220 begins to conduct current. In addition, switch circuit 222 may have a threshold voltage (or a "turn-on" voltage) at which point it begins to conduct current. Thus, when voltage source 110 reaches the characteristic activation voltage, thereby activating voltage sensing circuitry 220 (which produces control signal 230 as a result), switch circuit 222 may yet remain inactive. Instead, as the voltage produced by voltage source 110 increases, control signal 230 may increase in turn, until control signal 230 reaches the threshold voltage of switch circuit 222. Once control signal 230 reaches the threshold voltage of switch circuit 222, the latter begins to conduct current and may produce over-voltage signal 130 in response. In sum, over-voltage signal 130 may be produced, in accordance with some embodiments, only when the voltage produced by voltage source 110 reaches or exceeds the sum of the characteristic activation voltage (of voltage sensing circuitry 220) and the threshold voltage (of switch circuit 222). This voltage sum is equal to the trigger voltage (described above) of over-voltage detection circuit 120.

Switch circuit 222 may be any suitable configuration of circuitry that provides switch-like behavior, such as a transistor configured to output a high or low voltage. Switch-like behavior is defined by an output that rapidly transitions from a low voltage to a high voltage (or current) and/or vice-versa. Alternatively, in some embodiments, the switch circuit provides a more gradually increasing and/or decreasing signal. In this latter embodiment, logic circuitry 122 may clear the contents of volatile key registers 124 when over-voltage signal 130 reaches a sufficiently high (or sufficiently low) value. In one embodiment, switch circuit 222 includes a single transistor and a single resistor, as described below in connection with FIG. 3. However, it should be understood that switch circuit 222 may include any number of transistors and/or resistive elements.

In an exemplary embodiment, voltage sensing circuitry 220 and/or switch circuitry 222 may be inactive under normal operating conditions, e.g., when the voltage of voltage source 110 is less than that of the characteristic activation voltage (of voltage sensing circuitry 220). For example, the voltage of voltage source 110, under normal operating conditions, may be below the voltage required to "turn-on" the components within voltage sensing circuitry 220 and/or switch circuitry 222. As such, the leakage current (i.e., quiescent current) of voltage sensing circuitry 220 and/or switch circuitry 222 may be negligible.

In another embodiment, while voltage sensing circuitry 220 may be nominally active under normal operating conditions, switch circuitry 222 remains inactive until the voltage of voltage source 110 reaches or exceeds the trigger voltage. That is, when switch circuit 222 has a threshold voltage, the total voltage required to activate switch circuitry 222 may be higher than the total voltage required to activate voltage sensing circuitry 220. Thus, device 200 may safely operate at voltage conditions that activate voltage sensing circuitry 220 but do not activate switch circuitry 222. In addition, voltage sensing circuitry 220 may be configured to conduct minimal current in this nominal condition, thus decreasing nominal quiescent current of over-voltage detection circuit 120.

Although switch circuit 222 is primarily described herein as having a threshold voltage, it should be understood that, in some embodiments, switch circuit 222 does not have a threshold voltage, or has a negligible threshold voltage. In these embodiments, switch circuit 222 may immediately assert over-voltage signal 130 in response to receiving control signal 230 from voltage sensing circuitry 220. That is, switch circuit 222 may function to produce over-voltage signal 130 as soon as voltage sensing circuitry 220 is activated (i.e., when the voltage produced by supply 110 reaches or exceeds the characteristic activation voltage of voltage sensing circuitry 220).

FIG. 3 depicts an exemplary implementation of over-voltage detection circuitry 120 of FIG. 1, in accordance with some embodiments of the present invention. In particular, FIG. 3 shows illustrative device 300, which may be substantially similar to device 100 of FIG. 1 and/or device 200 of FIG. 2. As shown, over-voltage detection circuitry 120 includes diode stack 320, impedances 330 and 340, and transistor 350. Diode stack 320 may include any suitable number of diodes (e.g., three diodes). In some embodiments these diodes are connected in series, while in other embodiments these diodes are connected in parallel. However, it should be understood that the diodes within diode stack 320 may be connected in any suitable configuration, which may include a number of series connections and/or a number of parallel connections. In one embodiment, the diodes in diode stack 320 are low-leakage diodes. The type and number of diodes are selected such that the sum of the forward voltage drops over each of the diodes equals the desired characteristic activation voltage. For example, if a 2.1 volt characteristic activation voltage is desired, three diodes with forward voltage drops of 0.7 volts each may be chosen. Since the diodes are connected in series, diode stack 320 does not conduct current unless and until voltage source 110 reaches or exceeds 2.1 volts. A diode's forward voltage drop is also referred to herein as its "turn on" voltage.

As shows in FIG. 3, diode stack 320 may be coupled to voltage supply 110, impedance 330, and a terminal of transistor 350. In particular, diode stack 320 may be considered a two terminal device with one terminal coupled to supply 110, and the other terminal connected to impedance 330 and transistor 350. Diode stack 320 may contain any number of diodes (e.g., three diodes) connected to each other in series, with the diodes oriented so that, when active, current flows from the voltage supply through each diode and into impedance 330. When current passes through impedance 330, a voltage appears at the node connecting diode stack 320 with impedance 330 and transistor 350. This voltage may activate transistor 350, causing it to conduct current (e.g., when the voltage at the aforementioned node exceeds a threshold voltage of transistor 350).

Impedance 330 may be a resistor, or any other suitable resistive element. One terminal of impedance 330 may be connected to diode stack 320 and transistor 350, while the other terminal may be connected to a local electrical ground. Impedance 330 may be of any suitable value but, in an exemplary embodiment, it is a relatively large resistance. For instance, impedance 330 may be a resistor large enough so that transistor 350 begins conducting current virtually as soon as supply 110 reaches a voltage level equal to the sum of the characteristic voltage of diode stack 320 and the threshold voltage of the transistor. This resistance value also acts to limit the amount of current that flows through diode stack 320 and impedance 330 when the voltage of supply 110 is insufficient to activate transistor 350 but is sufficient to activate diode stack 320, i.e., the quiescent current of over-voltage detection circuit 120 when device 300 is subject to this intermediate voltage by supply 110.

Impedance 340 may also be a resistor, or any other suitable resistive element. One terminal of impedance 340 may be coupled to supply 110, while the other terminal may be connected to transistor 350 and/or to logic circuitry 122. In one embodiment, impedance 340 is a 10 kilohm resistor. However, it should be understood that, in other embodiments, impedance 340 may be a resistor of any suitable value. For example, impedance 340 may have a resistance value suitable for allowing transistor 350 to assert over-voltage signal 130 as soon as transistor 350 is activated (e.g., impedance 340 is large enough to allow the voltage level of over-voltage signal 130 to decrease sufficiently when supply 110 reaches the trigger voltage but small enough to sufficiently drive transistor 350). However, the resistance of impedance 340 is not so small as to inhibit or prevent the voltage at the node connecting impedance 340 with transistor 350 from falling to a voltage level necessary to trigger the register clearing functionality of logic circuitry 122, when supply 110 produces a voltage at or above the trigger voltage.

Transistor 350 may be any suitable transistor. For example, transistor 350 may be a metal-oxide-semiconductor field-effect transistor (MOSFET), such as an n-channel MOSFET (NMOS) transistor. It should be understood that any suitable switching component may be used in place of transistor 350, so long as the switch outputs a signal whenever diode stack 320 is active. In FIG. 3, when voltage supply 110 reaches or exceeds the trigger value, diode stack 320 becomes active (e.g., conducts current) and begins to turn on transistor 350. For example, if each diode in diode stack 320 has a forward voltage drop of 0.7 volts, and if transistor 350 also has a turn-on voltage (i.e., a threshold voltage) of 0.7 volts, then over-voltage signal 130 will begin to be asserted when supply 110 reaches 2.8 volts (i.e., the trigger voltage is 2.8 volts). Thus, the number and type of diodes in diode stack 320 may be chosen such that, when the forward voltages of the diodes are summed with the threshold voltage of transistor 350, the total voltage equals the desired trigger voltage.

Transistor 350 may be a three-terminal device. For example, in the case of a MOSFET, transistor 350 may have a gate, a source, and a drain. In the depicted embodiment, the gate of transistor 350 is connected to the node joining diode stack 320 and impedance 330; the drain is connected to the node joining impedance 340 and logic circuitry 122; and the source is connected to a local ground. It should be understood that the orientation of transistor 350 may vary depending on the type of device, e.g., the positions of the source and drain may be swapped when a p-channel MOSFET (PMOS) transistor is used. In one embodiment, transistor 350 has the same turn-on voltage as the diodes in diode stack 320. However, the turn-on voltage of transistor 350 may differ from those in diode stack 320, for instance, depending on the exact trigger voltage desired.

Although depicted without any intervening circuit elements, one or more circuit elements may be attached, in series, between the components of over-voltage detection circuitry 120 of FIG. 3. Similarly, additional circuit elements may be attached, in parallel, to the components of over-voltage detection circuitry 120. For example, in one embodiment, a large bypass capacitor may be attached in parallel to the diode stack 320 and impedance 330 to protect the circuit from electrostatic discharge. Moreover, it should be understood that one or more of the components depicted in FIG. 3 may be removed and/or substituted for another.

The use of diode stack 320 provides a desirable technique to detecting excessive voltage, as diodes conduct minimal current while inactive. For example, diode stack 320 remains inactive as long as supply 110 provides a voltage less than the characteristic activation voltage (e.g., normal operating conditions of device 300), and so there is little or no drain on a connected battery. On the other hand, diode stack 320 responds immediately to the application of excessive voltage, i.e., the diodes are activated as soon as supply 110 provides a voltage equal to the characteristic activation voltage. Thus, diode stack 320 provides a highly responsive solution to voltage detection characterized by low leakage current in the quiescent state. However, it should be understood that other suitable components may be used in place of diodes. For example, one or more resistive elements may be used in place of diode stack 320. In that case, the values of the resistive elements and impedance 330 must be carefully chosen so that the voltage divider produced activates transistor 350 only when voltage source 110 reaches or exceeds the desired trigger voltage.

Figure 4:
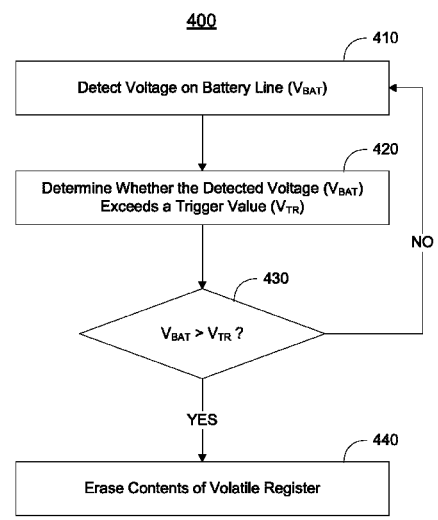
FIG. 4 is a flow chart of illustrative steps performed in over-voltage detection, according to an illustrative embodiment of the present invention.

FIG. 4 shows illustrative process 400 for securing a programmable integrated circuit device against an over-voltage attack. At step 410, the voltage on the battery line of the programmable integrated circuit device (i.e., the applied voltage) is detected. For example, the voltage of supply 110 of FIGS. 1-3 may be detected. In one embodiment, voltage detection includes determining the exact value of the voltage on the battery line, or a range of voltage levels within which the detected voltage falls. For example, the voltage may be sampled and compared to other, known voltages. In other embodiments, by contrast, the voltage is simply received by a circuit. For example, in FIGS. 1-3, over-voltage circuitry 120 is coupled to supply 110 and therefore has access to the voltage of supply 110. In one embodiment, over-voltage circuitry 120 is actually powered by supply 110.

At step 420, it is determined whether the detected voltage exceeds (or equals) a trigger voltage. The trigger voltage may be a predefined value. In some embodiments, the trigger voltage is the voltage required to activate, or turn on, the circuitry within over-voltage circuitry 120 of FIGS. 1-3. For example, as shown in FIG. 3, the trigger voltage is the sum of the forward voltage drops of each diode in diode stack 320 and the threshold voltage required to activate transistor 350. In other embodiments, the trigger voltage is a voltage output by another circuit, or a voltage value stored in a memory location, or any other suitable voltage level or value.

To determine whether the detected voltage exceeds (or equals) the trigger voltage, any suitable circuitry, or software, may be used. In an embodiment, circuitry may be configured to remain dormant (or "off") until the trigger voltage is reached; the fact that the circuitry is active (or "on") indicates that the detected voltage exceeds (or equals) the trigger voltage. For example, transistor 350 of FIG. 3 is configured to conduct current only when the trigger voltage is reached, otherwise it remains inactive, as discussed above in connection with FIG. 3. However, in other embodiments, a comparator may be used (e.g., implemented in hardware or software) to determine whether the detected voltage exceeds (or equals) the trigger voltage. For instance, the voltage on the battery line may be sampled using an analog-to-digital converter and compared to a stored trigger voltage value to determine if the voltage on the battery line exceeds (or equals) the trigger voltage. As another example, the voltage on the battery line may be compared to a trigger voltage using a comparator circuit. It should be understood that any suitable means of comparing the trigger value and the detected voltage may be used in accordance with various embodiments.

At step 430, if the detected voltage falls below the trigger voltage, process 400 returns to step 410 and continues monitoring the voltage on the battery line of the device. On the other hand, if the detected voltage exceeds or equals the trigger voltage, process 400 proceeds with step 440. At step 440, sensitive information within the device may be erased. For example, the contents of one or more volatile registers (e.g., storing an encryption key) may be overwritten with '0' values, '1' values, or a combination thereof. Referring to FIGS. 1-3, over-voltage signal 130 (which is asserted when supply voltage 110 reaches the trigger voltage) is received by logic circuitry 122, which proceeds to clear volatile registers 124.

In practice, one or more steps shown in process 400 may be combined with other steps, preformed in any suitable order, performed in parallel (e.g., simultaneously or substantially simultaneously), or removed. For example, steps 410 and 420 may be combined so that detecting the supply voltage and determining whether the detected voltage exceeds a trigger value are performed simultaneously. To wit, device 300 of FIG. 3 may perform these steps simultaneously insofar as over-voltage circuitry 120 produces over-voltage signal 130 in response to supply 110 reaching or exceeding the trigger voltage. Instead of separately detecting the voltage level and determining whether it exceeds the trigger value, the circuitry of over-voltage signal 130 is configured, simply, to "turn on" when that condition is true (as explained above). Finally, process 400 may be implemented using any suitable combination of hardware and/or software in any suitable fashion.

The above described embodiments of the present invention are presented for purposes of illustration and not of limitation, and the present invention is limited only by the claims which follow.

What is claimed is:

1. A programmable integrated circuit device comprising:
  a register configured to store a value of at least one bit, wherein the register is coupled to an applied voltage source through a battery line;
  over-voltage detection circuitry configured to:
    detect a voltage on the battery line produced by the applied voltage source; and
    generate an over-voltage signal if the detected voltage is greater than or equal to a trigger voltage that exceeds a maximum operating voltage of the programmable integrated circuit device; and
  logic circuitry configured to clear the register in response to the generated over-voltage signal.

2. The programmable integrated circuit device of claim 1, wherein the over-voltage detection circuitry is powered by the applied voltage source.

3. The programmable integrated circuit device of claim 1, wherein the over-voltage detection circuitry draws a negligible amount of current if the detected voltage is less than the trigger voltage.

4. The programmable integrated circuit device of claim 1, wherein the over-voltage detection circuitry comprises:
    a voltage sensing block, coupled to the applied voltage source, that has a characteristic activation voltage, wherein the voltage sensing block is configured to assert a control signal if the voltage produced by the applied voltage source exceeds or equals the characteristic activation voltage; and
    a switch circuit that is configured to produce the over-voltage signal in response to the control signal.

5. The programmable integrated circuit device of claim 4, wherein the voltage sensing block comprises a set of stacked diodes each having a turn-on voltage, and wherein the characteristic activation voltage is the sum of the turn-on voltages of each diode in the set.

6. The programmable integrated circuit device of claim 4, wherein the switch circuit has a threshold voltage, the trigger voltage equals the sum of the characteristic activation voltage and the threshold voltage, and the switch circuit is configured to produce the over-voltage signal in response to the control signal if the voltage produced by the applied voltage source exceeds or equals the trigger voltage.

7. The programmable integrated circuit device of claim 4, wherein the switch circuit comprises a transistor coupled to the applied voltage source.

8. A programmable integrated circuit device comprising:
    a register, coupled to an applied voltage source, that is configured to store a value of at least one bit;
    over-voltage detection circuitry comprising:
        a set of stacked diodes, coupled to the applied voltage source, that are operable to conduct current if a voltage produced by the applied voltage source is greater than or equal to a characteristic activation voltage, wherein the characteristic activation voltage is the total voltage required to activate each diode in the set of stacked diodes; and
        a transistor, coupled to the set of stacked diodes and to the register, that is operable to generate an over-voltage signal if the voltage produced by the applied voltage source is greater than or equal to the sum of the characteristic activation voltage and a threshold voltage, wherein the threshold voltage is the voltage required to activate the transistor; and
    logic circuitry operable to clear the register in response to the generated over-voltage signal.

9. The programmable integrated circuit device of claim 8, wherein the over-voltage detection circuitry further comprises:
    a first impedance that is coupled to the set of stacked diodes, the transistor, and a local ground; and
    a second impedance that is coupled to the applied voltage source, the transistor, and the register.

10. The programmable integrated circuit device of claim 9, wherein the first impedance and second impedance are resistors.

11. The programmable integrated circuit device of claim 9, wherein the transistor is an NMOS transistor, and wherein the gate of the transistor is coupled to the set of stacked diodes and the first impedance, the drain of the transistor is coupled to the second impedance and the register, and the source of the transistor is coupled to the local ground.

12. The programmable integrated circuit device of claim 8, wherein the set of stacked diodes comprises three low-leakage diodes, and wherein the characteristic activation voltage is substantially equal to 2.1 volts.

13. A method for securing a programmable integrated circuit device against an over-voltage attack, the method comprising:
    detecting a voltage on a battery line produced by an applied voltage source with over-voltage detection circuitry;
    generating, with the over-voltage detection circuitry, an over-voltage signal if the detected voltage is greater than or equal to a trigger voltage that exceeds a maximum operating voltage of the programmable integrated circuit device; and
    clearing a register, using logic circuitry, in response to the generated over-voltage signal, wherein the register is coupled to the applied voltage source through the battery line.

14. The method of claim 13 further comprising supplying power to the over-voltage detection circuitry through the applied voltage source.

15. The method of claim 13, wherein the over-voltage detection circuitry draws a negligible amount of current if the detected voltage is less than the trigger voltage.

16. The method of claim 13, wherein the over-voltage detection circuitry comprises a set of stacked diodes each having a turn-on voltage, and wherein the set of stacked low-leakage diodes is activated if the voltage produced by the applied voltage source is greater than or equal to the sum of the turn-on voltages of each diode in the set of stacked diodes.

17. The method of claim 16, wherein the over-voltage detection circuitry further comprises a transistor having a threshold voltage.

18. The method of claim 17, wherein generating the over-voltage signal comprises generated the over-voltage signal with the transistor if the voltage produced by the applied voltage source is greater than or equal to the sum of the turn-on voltages of each diode in the set and the threshold voltage.

19. The method of claim 13, wherein clearing the register comprises overwriting a volatile key with other data.

20. The method of claim 13, wherein detecting the voltage produced by the applied voltage source comprises detecting at least one of a voltage spike and a raised voltage sustained for a period of time.

* * * * *